(12) United States Patent
Miyoshi et al.

(10) Patent No.: US 8,853,735 B2
(45) Date of Patent: Oct. 7, 2014

(54) EPITAXIAL SUBSTRATE FOR SEMICONDUCTOR DEVICE AND SEMICONDUCTOR DEVICE

(71) Applicant: NGK Insulators, Ltd., Nagoya (JP)

(72) Inventors: Makoto Miyoshi, Inazawa (JP); Mikiya Ichimura, Ichinomiya (JP); Tomohiko Sugiyama, Nagoya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 33 days.

(21) Appl. No.: 13/623,308

(22) Filed: Sep. 20, 2012

(65) Prior Publication Data

US 2013/0015466 A1    Jan. 17, 2013

Related U.S. Application Data

(63) Continuation of application No. PCT/JP2011/055921, filed on Mar. 14, 2011.

(30) Foreign Application Priority Data

Mar. 24, 2010    (JP) ................................. 2010-068203

(51) Int. Cl.
| | | |
|---|---|---|
| *H01L 33/00* | (2010.01) | |
| *H01L 29/66* | (2006.01) | |
| *H01L 29/778* | (2006.01) | |
| *H01L 21/02* | (2006.01) | |
| *H01L 29/20* | (2006.01) | |
| *H01L 29/04* | (2006.01) | |
| *H01L 29/47* | (2006.01) | |
| *H01L 29/201* | (2006.01) | |

(52) U.S. Cl.
CPC ...... *H01L 29/7786* (2013.01); *H01L 29/66462* (2013.01); *H01L 29/475* (2013.01); *H01L*

(Continued)

(58) Field of Classification Search
USPC .......... 257/101, 102, 918, E33.026, E33.028, 257/E33.029, E33.031, E33.037; 438/607, 438/930
See application file for complete search history.

(56) References Cited

U.S. PATENT DOCUMENTS

2005/0274980 A1    12/2005    Miyoshi
2006/0121682 A1*    6/2006    Saxler ........................... 438/312

(Continued)

FOREIGN PATENT DOCUMENTS

| JP | 2006-032911 A1 | 2/2006 |
|---|---|---|
| JP | 2007-059850 A1 | 3/2007 |

(Continued)

OTHER PUBLICATIONS

Toshihide Kikkawa, "*Highly Reliable 250 W High Electron Mobility Transistor Power Amplifier*," Japanese Journal of Applied Physics, vol. 44, No. 7A, 2005, pp. 4896-4901.

(Continued)

*Primary Examiner* — Su Kim
(74) *Attorney, Agent, or Firm* — Burr & Brown, PLLC

(57) ABSTRACT

Provided is an epitaxial substrate for a semiconductor device, which has excellent schottky contact characteristics that are stable over time. The epitaxial substrate for a semiconductor device includes a base substrate, a channel layer formed of a first group III nitride containing at least Ga and having a composition of $In_{x1}Al_{y1}Ga_{z1}N$ ($x1+y1+z1=1$), and a barrier layer formed of a second group III nitride containing at least In and Al and having a composition of $In_{x2}Al_{y2}Ga_{z2}N$ ($x2+y2+z2=1$), wherein the barrier layer has tensile strains in an in-plane direction, and pits are formed on a surface of the barrier layer at a surface density of $5\times10^7/cm^2$ or more and $1\times10^9/cm^2$ or less.

10 Claims, 8 Drawing Sheets

(52) U.S. Cl.
CPC . 29/201 (2013.01); *H01L 21/02378* (2013.01); *H01L 21/0237* (2013.01); *H01L 29/2003* (2013.01); *H01L 29/045* (2013.01); *H01L 21/0254* (2013.01); *H01L 21/02458* (2013.01); *H01L 21/0262* (2013.01); *H01L 29/66068* (2013.01)
USPC ........ 257/102; 257/85; 257/86; 257/E33.026; 257/E33.031; 438/604; 438/607

(56) References Cited

U.S. PATENT DOCUMENTS

| | | | | |
|---|---|---|---|---|
| 2006/0237711 | A1* | 10/2006 | Teraguchi | 257/14 |
| 2007/0045662 | A1 | 3/2007 | Sumiya et al. | |
| 2010/0117118 | A1* | 5/2010 | Dabiran et al. | 257/190 |

FOREIGN PATENT DOCUMENTS

| | | |
|---|---|---|
| JP | 2007-142003 A1 | 6/2007 |
| JP | 2007-258230 A1 | 10/2007 |
| WO | 2009/119356 A1 | 10/2009 |
| WO | 2009/119357 A1 | 10/2009 |

OTHER PUBLICATIONS

Stacia Keller, et al., "*Gallium Nitride Based High Power Heterojunction Field Effect Transistors: Process Development and Present Status at USCB*," IEEE Trans. Electron Devices, vol. 48, No. 3, Mar. 2001, pp. 552-559.

F. Medjdoub, et al., "*Can InAlN/GaN Be an Alternative to High Power/High Temperature AlGaN/GaN Devices?*," IEEE IEDM Tech. Digest, 2006, pp. 673-676.

International Search Report dated May 31, 2011.

* cited by examiner

F I G . 1
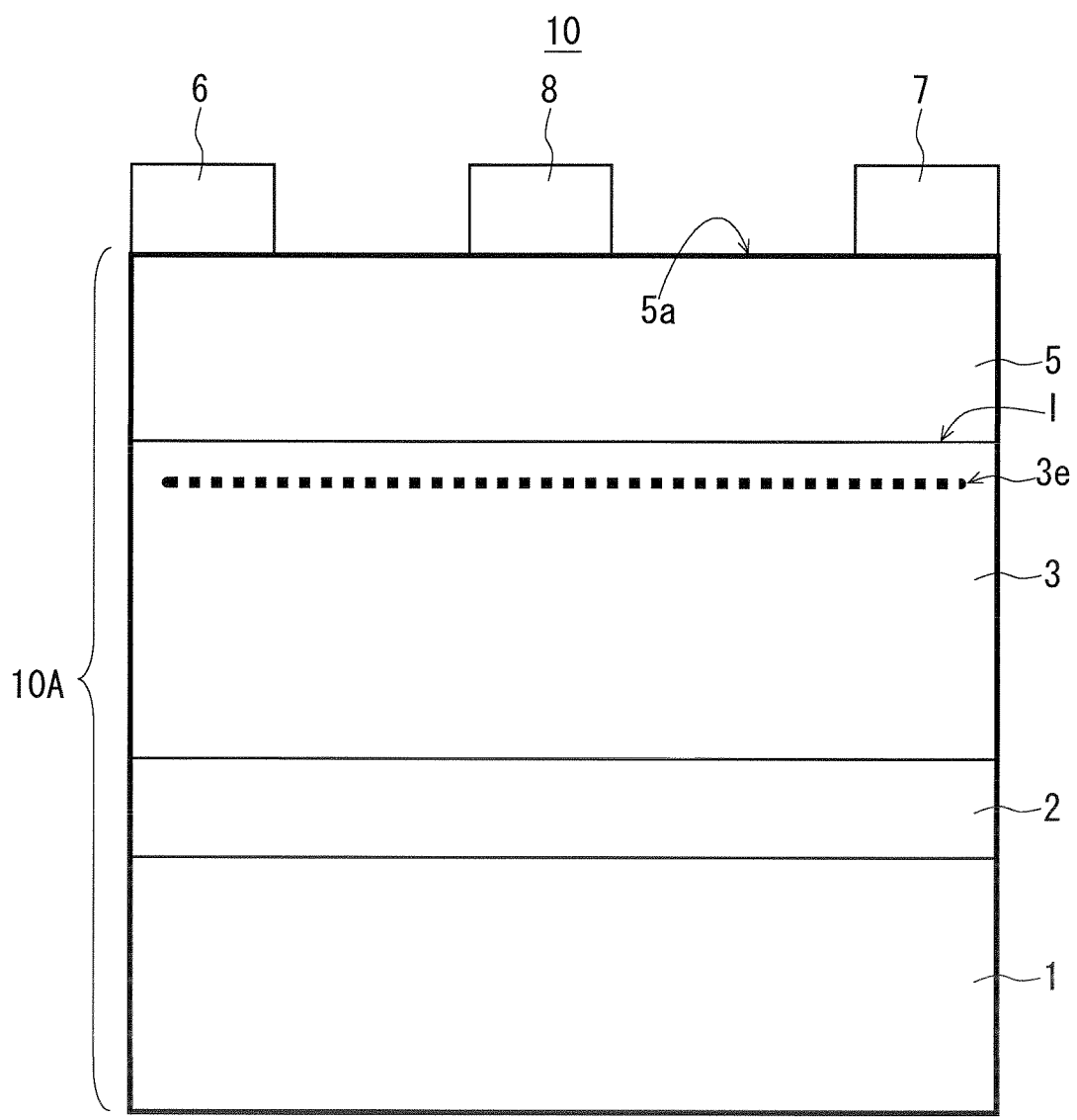

F I G. 2
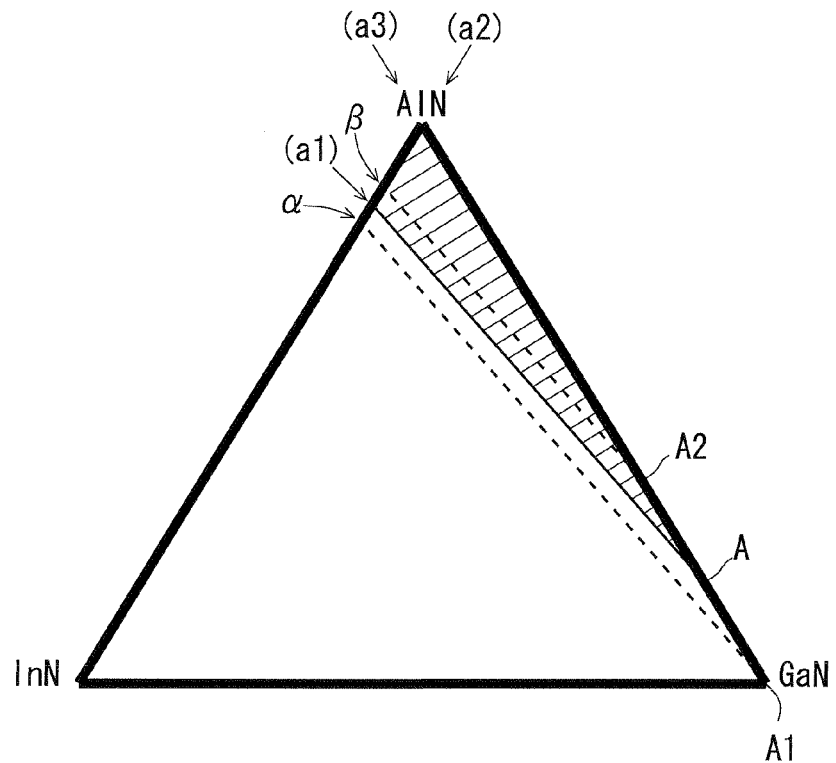
F I G. 3
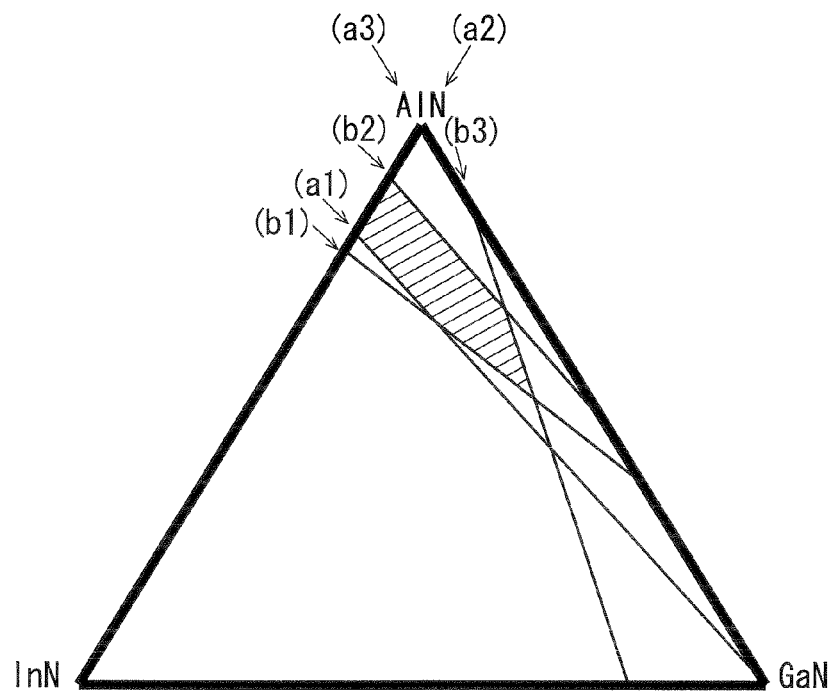

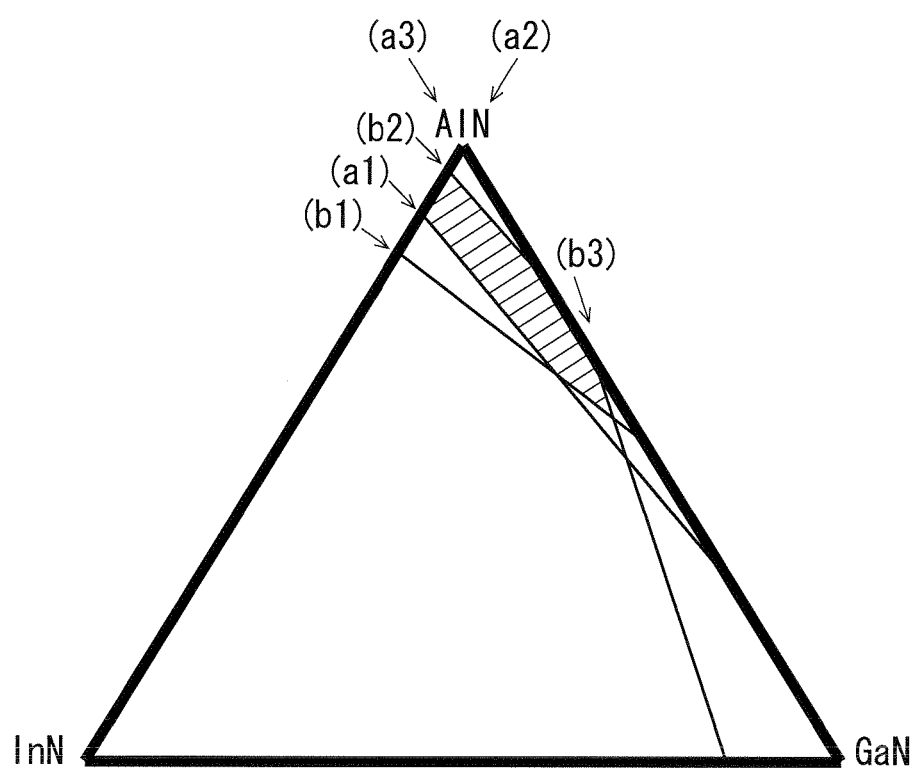
F I G . 6

FIG. 8

| COMPOSITION OF BARRIER LAYER | | | PRESSURE IN REACTOR IN FILM FORMING (kPa) | PIT DENSITY (NUMBER/cm2) | INITIAL CHARACTERISTICS | | AFTER CONTINUOUS CONDUCTION | |
|---|---|---|---|---|---|---|---|---|
| In x2 | Al y2 | Ga z2 | | | SHEET RESISTANCE ($\Omega$/sq) | LEAKAGE CURRENT (A/cm2) | LEAKAGE CURRENT (A/cm2) | BREAKDOWN VOLTAGE (V) |
| 0.17 | 0.83 | 0 | 1 | 1.1E+07 | 183 | 1.15E-04 | 4.50E-04 | 465 |
| | | | 5 | 5.6E+07 | 181 | 1.10E-04 | 1.15E-04 | 465 |
| | | | 20 | 7.8E+08 | 184 | 1.20E-04 | 1.20E-04 | 470 |
| | | | 50 | 2.0E+09 | 214 | 9.00E-04 | 9.75E-04 | 395 |
| 0.15 | 0.85 | 0 | 1 | 3.3E+07 | 175 | 1.05E-04 | 3.50E-04 | 465 |
| | | | 5 | 1.0E+08 | 172 | 1.10E-04 | 1.20E-04 | 470 |
| | | | 20 | 5.6E+08 | 169 | 1.20E-04 | 1.20E-04 | 470 |
| | | | 50 | 1.4E+09 | 197 | 6.30E-04 | 6.45E-04 | 400 |
| 0.12 | 0.88 | 0 | 1 | 1.1E+07 | 167 | 1.00E-04 | 3.20E-04 | 465 |
| | | | 5 | 5.0E+07 | 163 | 1.10E-04 | 1.25E-04 | 465 |
| | | | 20 | 7.8E+08 | 168 | 1.10E-04 | 1.25E-04 | 465 |
| | | | 50 | 1.6E+09 | 198 | 7.50E-04 | 7.65E-04 | 395 |
| 0.15 | 0.75 | 0.1 | 1 | 4.4E+07 | 206 | 1.10E-04 | 4.00E-04 | 465 |
| | | | 5 | 1.3E+08 | 200 | 1.30E-04 | 1.30E-04 | 470 |
| | | | 20 | 6.7E+08 | 205 | 1.25E-04 | 1.30E-04 | 470 |
| | | | 50 | 1.6E+09 | 244 | 6.90E-04 | 7.20E-04 | 390 |
| 0.13 | 0.77 | 0.1 | 1 | 4.4E+07 | 186 | 1.00E-04 | 3.50E-04 | 465 |
| | | | 5 | 8.9E+07 | 184 | 1.20E-04 | 1.25E-04 | 470 |
| | | | 20 | 8.9E+08 | 182 | 1.15E-04 | 1.20E-04 | 465 |
| | | | 50 | 2.1E+09 | 234 | 6.90E-04 | 7.20E-04 | 390 |
| 0.11 | 0.79 | 0.1 | 1 | 4.4E+07 | 185 | 1.10E-04 | 4.00E-04 | 470 |
| | | | 5 | 7.8E+07 | 182 | 1.20E-04 | 1.20E-04 | 475 |
| | | | 20 | 1.0E+09 | 183 | 1.20E-04 | 1.25E-04 | 470 |
| | | | 50 | 1.8E+09 | 225 | 7.50E-04 | 7.65E-04 | 390 |
| 0.13 | 0.67 | 0.2 | 1 | 2.2E+07 | 192 | 1.00E-04 | 3.10E-04 | 470 |
| | | | 5 | 6.7E+07 | 193 | 1.10E-04 | 1.20E-04 | 470 |
| | | | 20 | 7.8E+08 | 191 | 1.10E-04 | 1.20E-04 | 475 |
| | | | 50 | 1.7E+09 | 234 | 6.90E-04 | 7.20E-04 | 385 |
| 0.11 | 0.69 | 0.2 | 1 | 3.3E+07 | 171 | 1.09E-04 | 3.80E-04 | 470 |
| | | | 5 | 1.2E+08 | 175 | 1.12E-04 | 1.20E-04 | 470 |
| | | | 20 | 8.3E+08 | 174 | 1.10E-04 | 1.19E-04 | 470 |
| | | | 50 | 1.5E+09 | 194 | 8.40E-04 | 8.40E-04 | 400 |
| 0.09 | 0.71 | 0.2 | 1 | 3.3E+07 | 174 | 1.00E-04 | 3.50E-04 | 470 |
| | | | 5 | 1.0E+08 | 170 | 1.10E-04 | 1.15E-04 | 465 |
| | | | 20 | 7.2E+08 | 172 | 1.10E-04 | 1.15E-04 | 470 |
| | | | 50 | 1.7E+09 | 205 | 7.80E-04 | 7.95E-04 | 390 |
| 0.115 | 0.585 | 0.3 | 1 | 1.1E+07 | 229 | 1.00E-04 | 3.80E-04 | 465 |
| | | | 5 | 1.3E+08 | 228 | 1.15E-04 | 1.20E-04 | 470 |
| | | | 20 | 1.0E+09 | 225 | 1.10E-04 | 1.20E-04 | 470 |
| | | | 50 | 1.8E+09 | 256 | 6.75E-04 | 7.05E-04 | 380 |
| 0.09 | 0.61 | 0.3 | 1 | 3.3E+07 | 194 | 1.10E-04 | 4.20E-04 | 470 |
| | | | 5 | 1.1E+08 | 196 | 1.20E-04 | 1.20E-04 | 475 |
| | | | 20 | 8.9E+08 | 198 | 1.20E-04 | 1.20E-04 | 470 |
| | | | 50 | 2.0E+09 | 234 | 6.00E-04 | 6.30E-04 | 390 |
| 0.07 | 0.63 | 0.3 | 1 | 3.3E+07 | 172 | 1.00E-04 | 4.50E-04 | 465 |
| | | | 5 | 2.0E+08 | 171 | 1.10E-04 | 1.20E-04 | 460 |
| | | | 20 | 6.7E+08 | 173 | 1.20E-04 | 1.20E-04 | 470 |
| | | | 50 | 1.4E+09 | 198 | 6.75E-04 | 6.90E-04 | 390 |

PRESSURE IN REACTOR
1kPa

PRESSURE IN REACTOR
20kPa

PRESSURE IN REACTOR
50kPa

US 8,853,735 B2

EPITAXIAL SUBSTRATE FOR SEMICONDUCTOR DEVICE AND SEMICONDUCTOR DEVICE

TECHNICAL FIELD

The present invention relates to an epitaxial substrate that has a multi-layer structure composed of a group III nitride semiconductor, and more particularly, to a multi-layer structured epitaxial substrate for electronic devices.

BACKGROUND ART

Nitride semiconductors having high breakdown electric field and high saturation electron velocity have been attracting attention as the next generation of semiconductor materials for high-frequency/high-power devices. For example, a high electron mobility transistor (HEMT) device formed by laminating a barrier layer composed of AlGaN and a channel layer composed of GaN takes advantage of the feature that a high-concentration two-dimensional electron gas (2DEG) is generated at a lamination interface (hetero interface) owing to large polarization effects (spontaneous polarization effect and piezo polarization effect) inherent in a nitride material (for example, see Non-Patent Document 1).

As a base substrate of the substrate for a HEMT device, for example, a single crystal (heterogeneous single crystal) having a composition different from that of a group III nitride, such as silicon and SiC, is used in some cases. In those cases, a buffer layer such as a strained superlattice layer or a low-temperature growth buffer layer is typically formed as an initial growth layer on the base substrate. Therefore, the most basic configuration of a substrate for a HEMT device including a base substrate formed of heterogeneous single crystal is obtained by epitaxially forming a barrier layer, a channel layer and a buffer layer on a base substrate. In addition, for the purpose of accelerating spatial confinement of a two-dimensional electron gas, a spacer layer having a thickness of approximately 1 nm is provided between the barrier layer and the channel layer in some cases. The spacer layer is composed of, for example, AlN. Moreover, for the purposes of controlling an energy level on the uppermost surface of the substrate for a HEMT device and improving contact characteristics with an electrode, for example, a cap layer composed of an n-type GaN layer or a superlattice layer is formed on the barrier layer in some cases.

In a case of a nitride HEMT device having the most typical configuration in which a channel layer is formed of GaN and a barrier layer is formed of AlGaN, it is known that the concentration of a two-dimensional electron gas existing in a substrate for a HEMT device increases along with an increase in AlN mole fraction of AlGaN that forms the barrier layer (for example, see Non-Patent Document 2). It is conceivable that controllable current density of a HEMT device, that is, power density capable of being utilized can be improved significantly if the concentration of a two-dimensional electron gas can be increased significantly.

Further, growing attention is paid to the HEMT device that has a low dependence on the piezo polarization effect, is capable of generating a two-dimensional electron gas at high concentration almost only by spontaneous polarization, and has the structure with small strains, such as the HEMT device in which a channel layer is composed of GaN and a barrier layer is composed of InAlN (for example, see Non-Patent Document 3).

In order to put the above-mentioned HEMT device or a substrate for a HEMT device that is a multi-layer structure used in manufacturing the same to practical use, various problems need to be solved; problems related to performance improvement such as increases of power density and efficiency, problems related to functional improvement such as achieving a normally-off operation, and fundamental problems such as enhancing reliability and reducing cost. The above-mentioned problems are individually tackled vigorously.

One of the above-mentioned problems is how to improve schottky contact characteristics between a gate electrode and a barrier layer. For example, the inventors of the present invention have confirmed that in a case where epitaxial substrates for HEMT devices, in each of which a channel layer is composed of GaN and a barrier layer is composed of InAlGaN, are manufactured and a continuous current test for schottky junction between the gate electrode and the barrier layer is performed, there are found some epitaxial substrates (early deteriorating samples) whose leakage current becomes larger at an early stage immediately after the current conduction compared with before the start of the current conduction. It has also been confirmed that such early deteriorating samples have a high sheet resistance and that pits or cracks occur newly on the surface of the barrier layer.

PRIOR ART DOCUMENTS

Non-Patent Documents

Non-Patent Document 1: "Highly Reliable 250 W High Electron Mobility Transistor Power Amplifier", Toshihide Kikkawa, Jpn. J. Appl. Phys. 44 (2005), p. 4896.

Non-Patent Document 2: "Gallium Nitride Based High Power Heterojunction Field Effect Transistors: Process Development and Present Status at USCB", Stacia Keller, Yi-Feng Wu, Giacinta Parish, Naiqian Ziang, Jane J. Xu, Bernd P. Keller, Steven P. DenBaars, and Umesh K. Mishra, IEEE Trans. Electron Devices 48 (2001), p. 552.

Non-Patent Document 3: "Can InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, p. 673.

SUMMARY OF THE INVENTION

The present invention has been made in view of the above-mentioned problems, and an object thereof is to provide an epitaxial substrate for a semiconductor device, which has excellent schottky contact characteristics that are stable over time.

In order to solve the above-mentioned problems, a first aspect of the present invention relates to an epitaxial substrate for semiconductor device, which includes: a base substrate; a channel layer formed of a first group III nitride containing at least Ga and having a composition of $In_{x1}Al_{y1}Ga_{z1}(x1+y1+z1=1)$; and a barrier layer formed of a second group III nitride containing at least In and Al and having a composition of $In_{x2}Al_{y2}Ga_{z2}N$ $(x2+y2+z2=1)$, wherein the composition of the first group III nitride falls within a range determined by $x1=0$ and $0 \leq y1=0.3$, and the composition of the second group III nitride falls, in a ternary phase diagram with InN, AlN and GaN being vertices, within a first composition range surrounded by straight lines respectively represented by expressions below determined in accordance with the composition of the first group III nitride, the barrier layer has tensile strains in an in-plane direction, and pits are formed on a surface of the barrier layer at a surface density of $5 \times 10^7/cm^2$ or more and $1 \times 10^9/cm^2$ or less.

$$x2 = \frac{y2 - y1}{4.56} = -\frac{z2 - (1 - y1)}{5.56}$$

$$z2 = 0$$

$$x2 = 0$$

In a second aspect of the present invention, in the epitaxial substrate for semiconductor device according to the first aspect, the composition of the second group III nitride falls within the first composition range and further falls within a range surrounded by straight lines respectively represented by expressions below.

$$x2 = \frac{y2 - (0.36 + 0.5y1)}{1.78} = -\frac{z2 - (0.64 - 0.5y1)}{2.78}$$

$$x2 = \frac{y2 - (0.45 + y1)}{4.5} = -\frac{z2 - (0.55 - y1)}{5.5}$$

$$x2 = -\frac{y2 - (0.9 - 0.7y1)}{4.5} = \frac{z2 - (0.1 + 0.7y1)}{3.5}$$

In a third aspect of the present invention, the epitaxial substrate for semiconductor device according to the first or second aspects further includes a spacer layer of AlN between the channel layer and the barrier layer.

In a fourth aspect of the present invention, in the epitaxial substrate for semiconductor device according to any one of the first to three aspects, the first group III nitride is GaN.

In a fifth aspect of the present invention, a semiconductor device is manufactured by using the epitaxial substrate for semiconductor device according to any one of the first to fourth aspects.

Effects of the Invention

According to the first to fifth aspects of the present invention, an epitaxial substrate having excellent schottky contact characteristics that are stable over time and a semiconductor device including the epitaxial substrate are achieved.

According to the second aspect, in particular, an epitaxial substrate having high concentration of a two-dimensional electron gas is achieved.

BRIEF DESCRIPTION OF DRAWINGS

FIG. 1 is a schematic cross-sectional view schematically showing an epitaxial substrate 10A according to a first embodiment and a configuration of a HEMT device 10 manufactured using the same.

FIG. 2 is a ternary phase diagram showing a first composition range of a barrier layer 5.

FIG. 3 is a ternary phase diagram showing a second composition range in a case where a channel layer 3 is composed of GaN.

FIG. 6 is a ternary phase diagram showing the second composition range in a case where the channel layer 3 is composed of $Al_{0.3}Ga_{0.7}N$.

FIG. 8 is a diagram showing a list of formation conditions for the barrier layer 5 and evaluation results in Example.

EMBODIMENTS FOR CARRYING OUT THE INVENTION

First Embodiment

Configuration of Epitaxial Substrate

Figure 4:
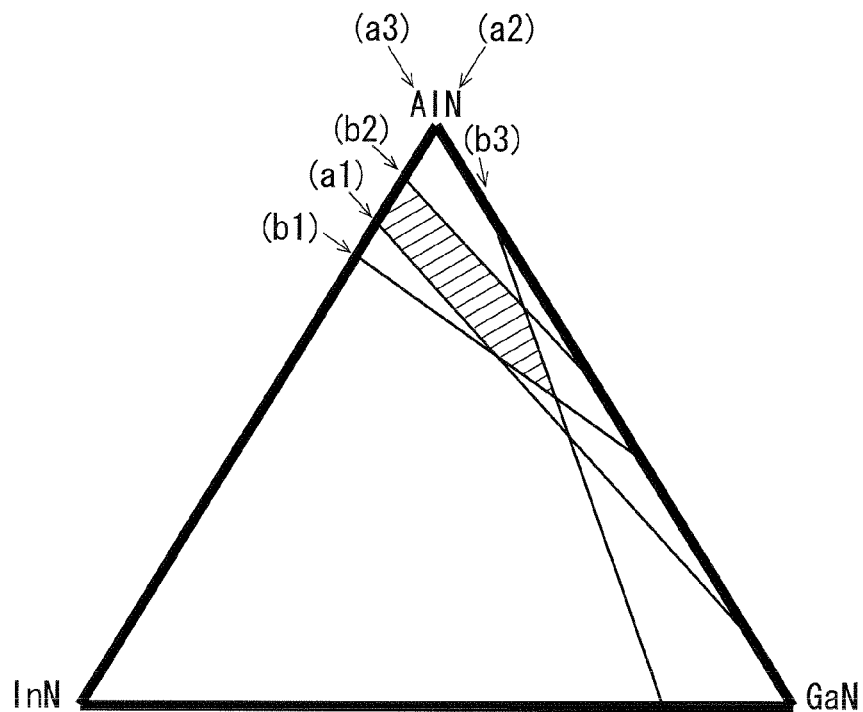
FIG. 4 is a ternary phase diagram showing the second composition range in a case where the channel layer 3 is composed of $Al_{0.1}Ga_{0.9}N$.

FIG. 1 is a schematic cross-sectional view schematically showing an epitaxial substrate 10A according to a first embodiment of the present invention and the configuration of a HEMT device 10 manufactured using the same. The epitaxial substrate 10A has the configuration in which a substrate 1, a buffer layer 2, a channel layer 3 and a barrier layer 5 are formed by lamination. As a preferred example, the buffer layer 2, the channel layer 3 and the barrier layer 5 are each epitaxially formed (details thereof are described below) using the metal organic chemical vapor deposition method (MOCVD method). Note that the ratios of the respective layers in FIG. 1 do not reflect actual ones.

Hereinbelow, description is given of a case where the MOCVD method is used for the formation of each layer. However, other epitaxial growth technique, for example, the method appropriately selected from various vapor phase growth methods and liquid phase growth methods such as MBE, HVPE and LPE may be used, or different growth methods may be used in combination, as long as they are the techniques capable of forming each layer for providing excellent crystallinity thereto.

Any substrate may be used as the substrate 1 as long as a nitride semiconductor layer having excellent crystallinity can be formed thereon, without any particular limitation. A 6H-SiC single crystal substrate is preferably used as an example, and a substrate composed of sapphire, Si, GaAs, spinel, MgO, ZnO, ferrite or the like may be used.

The buffer layer 2 is a nitride layer formed for making crystal quality of the channel layer 3 and the barrier layer 5 that are formed thereon excellent. For example, in a case of using SiC as the base substrate, the buffer layer 2 composed of AlN is preferably formed to have a thickness of approximately 200 nm.

The channel layer 3 is a layer formed of a group III nitride (first group III nitride) having a composition of $In_{x1}Al_{y1}Ga_{z1}N$ (x1+y1+z1=1) so as to have a thickness of approximately several μm. In this embodiment, the channel layer 3 is formed so as to satisfy a composition range of x1=0 and 0≤y1≤0.3. In the case where 0.3<y1≤1, the cristallinity of the channel layer 3 itself deteriorates remarkably, which makes it difficult to obtain the epitaxial substrate 10A having excellent electrical characteristics.

Meanwhile, the barrier layer 5 is a layer formed of a group III nitride (second group III nitride) represented by a compositional formula of $In_{x2}Al_{y2}Ga_{z2}N$ (where x2+y2+z2=1) so as to have a thickness of approximately several nm to several tens of nm. The barrier layer 5 is described below in detail.

As shown in FIG. 1, the HEMT device 10 is configured by further providing a source electrode 6, a drain electrode 7 and a gate electrode 8 on the barrier layer 5. In such a case, it is preferable to form the source electrode 6 and the drain electrode 7 as multi-layer metal electrodes composed of Ti/Al/Ni/Au each having a thickness of approximately ten and several nm to hundred and several tens of nm. The source electrode 6 and the drain electrode 7 are formed to have ohmic contact with the barrier layer 5. Meanwhile, the gate electrode 8 is preferably formed as a multi-layer metal electrode composed of Pd/Au each having a thickness of approximately ten and several nm to hundred and several tens of nm. The gate electrode 8 is formed to have schottky contact with the barrier layer 5.

Note that the metal used for the source electrode 6 and the drain electrode 7 is not limited to the multi-layer metal composed of Ti/Al/Ni/Au as long as excellent ohmic contact can be obtained for the semiconductor epitaxial substrate according to the present invention and, for example, Ti/Al/Pt/Au or Ti/Al can be used. Similarly, the metal used for the gate electrode 8 is not limited to Pd/Au as long as excellent schottky contact can be obtained for the semiconductor epitaxial substrate according to the present invention and, for example, Pd/Ti/Au or Ni/Au can be used.

In the epitaxial substrate 10A having the above-mentioned layer configuration, an interface between the channel layer 3 and the barrier layer 5 becomes a heterojunction interface. A two-dimensional electron gas region 3e in which a two-dimensional electron gas is present at high concentration is foamed at the interface mainly by the spontaneous polarization effect.

In order to preferably generate a two-dimensional electron gas, the interface is formed such that a mean roughness falls within a range of 0.1 nm to 3 nm and a mean square roughness falls within a range of 0.1 nm to 3 nm. Note that a flat interface may be formed exceeding the above-mentioned ranges, which is not practical considering cost and manufacturing yield. Preferably, the interface is formed such that a mean roughness falls within a range of 0.1 nm to 1 nm and a mean square roughness falls within a range of 0.1 nm to 1 nm.

<Barrier Layer>

Next, description is given of the configuration of the barrier layer 5, which is characteristic of this embodiment. Specifically, the barrier layer 5 has characteristics of a composition range and a surface form that the barrier layer 5 may take.

First, the barrier layer 5 is formed to have in-plane tensile strains. This is achieved by comparing a lattice constant in an in-plane direction in the state where no strain exists between the second group III nitride that forms the barrier layer 5 and the first group III nitride that forms the channel layer 3 serving as a base in the formation of the barrier layer 5, and then selecting the composition of the second group III nitride from the composition range in which the former has a smaller value than the latter. The above-mentioned composition is selected for epitaxial growth, whereby the barrier layer 5 is formed so as to be aligned with the channel layer 3, which results in in-plane tensile strains in the barrier layer 5.

Meanwhile, formed on a surface 5a of the barrier layer 5 are pits at a surface density of $5 \times 10^7/cm^2$ or more and $1 \times 10^9/cm^2$ or less. That is, pits are intentionally introduced in the barrier layer 5 in its formation. This is achieved by, for example, appropriately adjusting a pressure in a reactor in the formation of the barrier layer 5. The size of the pit is approximately 60 nm or more and 120 nm or less in diameter on the surface 5a of the barrier layer 5.

In a case where the barrier layer 5 is formed to have tensile strains, normally, strain energy is stored in the barrier layer 5. Accordingly, if the schottky junction portion is continuously conducted, the strain energy is released and unnecessary defects penetrating the barrier layer 5 are formed. As a result, the defects may serve as a conduction path for a leakage current and the leakage current may increase. In the case of the epitaxial substrate 10A according to this embodiment, however, defects passing through the barrier layer 5 are hardly formed even if continuous conduction is performed, and a leakage current remains suppressed in a preferential manner. The reason for this is conceivable as follows; in the case of the epitaxial substrate 10A according to this embodiment, pits have been present on the surface 5a of the barrier layer 5 at the surface density within the above-mentioned range, and accordingly, strain energy is preferentially and locally released in the pits even if the schottky junction portion is conducted, which does not lead to the formation of defects causing an increase in leakage current.

That is, the epitaxial substrate 10A includes the barrier layer 5 having the above-mentioned characteristics of the composition and pit density described above, and accordingly has excellent schottky contact characteristics that are assured stability over time. Specifically, the leakage current in the schottky junction portion obtained by forming a schottky contact electrode on the barrier layer 5 is suppressed to be 0.2 $mA/cm^2$ or less after continuous conduction as well as immediately after manufacturing. This reference value of the leakage current, 0.2 $mA/cm^2$, applies to the case where the leakage current is 0.2 μA or less in a device in which a schottky junction electrode is formed on the surface 5a of the barrier layer 5 so as to have a junction area of 0.1 $mm^2$ (for example, a case where 100 schottky electrodes each having a shape of 1 μm×1 mm are disposed in a comb electrode HEMT device applies to this). A leakage current exceeding this reference value leads to an increase in power loss, which is not preferable in terms of device operation.

In a case where pits present on the surface 5a of the barrier layer 5 are less than $5 \times 10^7/cm^2$, strain energy of pits that have been present is not sufficiently released, and thus, pits or cracks serving as conduction paths upon conduction are newly formed. As a result, a leakage current increases, which is not preferable. On the other hand, in a case where pits present on the surface 5a of the barrier layer 5 are more than $1 \times 10^9/cm^2$, initial characteristics are insufficient such that a value of the leakage current exceeds 0.2 $mA/cm^2$ or a sheet resistance decreases considerably, which is not preferable.

FIG. 2 is a ternary phase diagram with three components of InN, AlN and GaN being vertices, which shows a specific composition range (first composition range) of the second group III nitride in a case where the barrier layer 5 is formed to have in-plane tensile strains. The range (diagonally shaded portion in FIG. 2) surrounded by three straight lines respectively represented by Expressions (a1) to (a3) below in the ternary phase diagram of FIG. 2 is a first composition range.

If the composition of the second group III nitride is selected from the first composition range, the barrier layer 5 is formed to have tensile strains.

$$x2 = \frac{y2 - y1}{4.56} = -\frac{z2 - (1 - y1)}{5.56} \quad \text{(a1)}$$

$$z2 = 0 \quad \text{(a2)}$$

$$x2 = 0 \quad \text{(a3)}$$

Expression (a1) includes the composition of the channel layer 3 (specifically, value of y1 when x1=0) as a variable. This means that the first composition range varies in accordance with the composition of the first group III nitride. Also, FIG. 2 shows that the barrier layer 5 has tensile strains if the composition of the second group III nitride is selected from the Al-richer composition range than that of the straight line represented by Expression (a1). A point A (0, y1, 1−y1) through which the straight line represented by Expression (a1) passes shows the composition of the second group III nitride in a case where it coincides with the composition of the first group III nitride. The position of the point A also varies in accordance with a value of y1 because y1 is included in variables. For example, a point A1 (0, 0, 1) and a point A2 (0, 0.3, 0.7) correspond to the positions of the point A when y1=0 and y1=0.3. In FIG. 2, the cases where the straight line represented by Expression (a1) passes through the point A1 and the point A2 are indicated by dashed lines α and β, respectively.

Preferably, the two-dimensional electron gas concentration of $2 \times 10^{13}/\text{cm}^2$ or more can be obtained in the two-dimensional electron gas region 3e if, of the first composition range described above, the composition of the second group III nitride is selected from the composition range (second composition range) surrounded by three straight lines represented by Expressions (b1) to (b3) described below.

$$x2 = \frac{y2 - (0.36 + 0.5y1)}{1.78} = -\frac{z2 - (0.64 - 0.5y1)}{2.78} \quad \text{(b1)}$$

$$x2 = \frac{y2 - (0.45 + y1)}{4.5} = -\frac{z2 - (0.55 - y1)}{5.5} \quad \text{(b2)}$$

$$x2 = -\frac{y2 - (0.9 - 0.7y1)}{4.5} = \frac{z2 - (0.1 + 0.7y1)}{3.5} \quad \text{(b3)}$$

Figure 5:
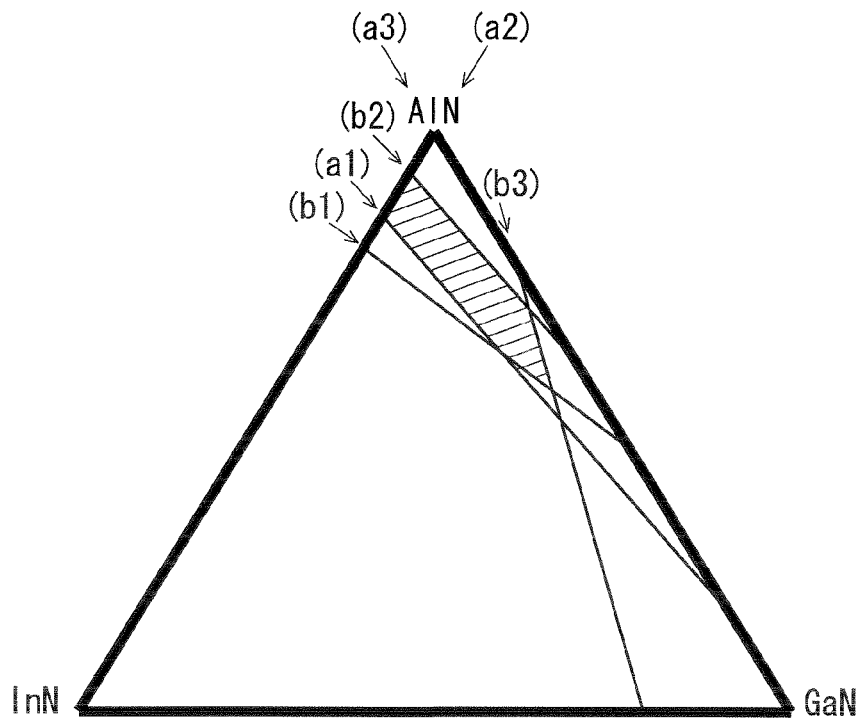
FIG. 5 is a ternary phase diagram showing the second composition range in a case where the channel layer 3 is composed of $Al_{0.2}Ga_{0.8}N$.

FIGS. 3, 4, 5 and 6 are ternary phase diagrams with three components of InN, AlN and GaN being vertices, which show the second composition range appropriate for the composition of the channel layer 3. The diagonally shaded portion of each diagram shows the second composition range. The composition of the channel layer 3 corresponding to each diagram is as follows:

FIG. 3: GaN (x1=y1=0, z1=1);
FIG. 4. $Al_{0.1}Ga_{0.9}N$ (x1=0, y1=0, z1=0.9);
FIG. 5: $Al_{0.2}Ga_{0.8}N$ (x1=0, y1=0.2, z1=0.8); and
FIG. 6: $Al_{0.3}Ga_{0.7}N$ (x1=0, y1=0.3, z1=0.7).

Note that the discussion regarding the above-mentioned first and second composition ranges do not exclude a fact that the channel layer 3 and the barrier layer 5 may contain impurities. For example, the channel layer 3 and the barrier layer 5 may contain oxygen atoms in the concentration range of 0.0005 at % ($1 \times 10^{17}/\text{cm}^3$) or more to 0.05 at % ($1 \times 10^{19}/\text{cm}^3$) or less, or may contain carbon atoms in the concentration range of 0.0010 at % ($2 \times 10^{17}/\text{cm}^3$) or more to 0.05 at % ($1 \times 10^{19}/\text{cm}^3$) or less. Note that the concentrations of oxygen atoms and carbon atoms may be smaller than respective lower limits in the above-mentioned ranges, which is not practical considering cost and manufacturing yield. On the other hand, the concentrations of oxygen atoms and carbon atoms exceeding respective upper limits in the above-mentioned ranges may result in the deterioration in cristallinity of each layer to such an extent that device characteristics deteriorate, which is not desirable.

<Manufacturing Method for Epitaxial Substrate>

Next, description is given of a method of manufacturing the epitaxial substrate 10A in which the channel layer 3 and the barrier layer 5 have the above-mentioned composition ranges.

The epitaxial substrate 10A can be manufactured with a known MOCVD reactor. Specifically, there is used an MOCVD reactor configured such that a reactor can be supplied with a metal organic (MO) source gas (TMI, TMA and TMG) for In, Al and Ga, an ammonia gas, a hydrogen gas and a nitrogen gas.

First, for example, a 6H-SiC substrate that has (0001) plane orientation and a diameter of three inches is prepared as the substrate 1, and the substrate 1 is placed on a susceptor provided in the reactor of the MOCVD reactor. The inside of the reactor is replaced with a vacuum gas, and then, an atmosphere in a hydrogen/nitrogen mixed flow state is formed while maintaining a pressure in the reactor at a predetermined value of 5 kPa to 50 kPa (for example, 30 kPa). Then, the temperature of the substrate is raised through susceptor heating.

When the susceptor temperature reaches a predetermined temperature of 950° C. to 1,250° C. (for example, 1,100° C.), which is a buffer layer forming temperature, an Al source gas and a $NH_3$ gas are introduced into the reactor, thereby forming an AlN layer serving as the buffer layer 2.

After the formation of the AlN layer, the susceptor temperature is maintained at a predetermined channel layer forming temperature T1 (° C.), and a metal organic source gas and an ammonia gas are introduced into the reactor in accordance with the composition of the channel layer 3, thereby forming an $In_{x1}Al_{y1}Ga_{z1}N$ layer (where x1=0, 0≤y1≤0.3) serving as the channel layer 3. Here, the channel layer forming temperature T1 is a value determined in the temperature range where 950° C.≤T1≤1,250° C. in accordance with a value of an AlN mole fraction y1 of the channel layer 3. Note that the pressure in the reactor when forming the channel layer 3 is not particularly limited, and can be appropriately selected from the range of 10 kPa to an atmospheric pressure (100 kPa).

After the formation of the $In_{x1}Al_{y1}Ga_{z1}N$ layer, next, the susceptor temperature is maintained at a predetermined barrier layer forming temperature T2 (° C.), and then a nitrogen gas atmosphere is formed in the reactor. Here, the barrier layer forming temperature T2 is determined in the range of 650° C. or higher to 800° C. or lower in accordance with the In composition ratio.

Next, an ammonia gas and a metal organic source gas that has a flow rate appropriate for the composition of the barrier layer 5 are introduced into the reactor such that a so-called V/III ratio takes a predetermined value of 3,000 or more and 20,000 or less, and then an $In_{x2}Al_{y2}Ga_{z2}N$ layer serving as the barrier layer 5 is formed to have a predetermined thickness. In that case, the $In_{x2}Al_{y2}Ga_{z2}N$ layer is formed so as to satisfy the first composition range, or further satisfy the second composition range. Note that the range of the growth rate of the barrier layer 5 is preferably 0.01 to 0.1 μm/h.

In the formation of the barrier layer 5, the pressure in the reactor is maintained at a predetermined value between 3 kPa and 30 kPa, and more preferably, a predetermined value between 5 kPa and 20 kPa. In the case of this embodiment, the surface density of pits formed on the surface 5a of the barrier layer 5 is dependent on the value of the pressure in the reactor. The pressure in the reactor of 3 kPa to 30 kPa enables to form pits at the surface density in a preferable range of $5 \times 10^{17}/cm^2$ or more and $1 \times 10^{19}/cm^2$ or less.

Note that in the case where the V/III ratio is a predetermined value in the range of 3,000 or more to 7,500 or less, the formation is made such that the interface I between the channel layer 3 and the barrier layer 5 has a mean roughness of 0.1 nm to 1 nm and the surface 5a of the barrier layer 5 has a mean square roughness of 0.1 nm to 1 nm in a field of view of 5 μm×5 μm.

Further, in this embodiment, a nitrogen gas is used for all of the bubbling gas formed of metal organic source and a carrier gas in manufacturing the barrier layer 5. That is, the atmosphere gas other than a source gas is only a nitrogen gas. Accordingly, a nitrogen partial pressure in the reactor increases, whereby the reaction between In and nitrogen can be caused to progress in a highly activated state even in a temperature range of 800° C. or lower where the decomposition rate of an ammonia molecule is relatively low. As a result, even in a case where the barrier layer 5 is composed of a nitride containing In, it is possible to form this in a stable manner. Further, the electronic structure of the barrier layer 5 can be maintained in an ideal state, whereby the generation of a two-dimensional electron gas is achieved at high concentration in the two-dimensional electron gas region 3e. Note that it is not preferable to intentionally mix a hydrogen gas into the atmosphere in manufacturing the barrier layer 5 because this causes a decrease in concentration of the two-dimensional electron gas.

Manufacturing of the epitaxial substrate 10A is completed after the formation of the barrier layer 5.

The HEMT device 10 is obtained by forming the source electrode 6, the drain electrode 7 and the gate electrode 8 on the surface of the obtained epitaxial substrate 10A (surface 5a of the barrier layer 5) with a well-known thin film forming technique or photolithography process.

As described above, according to this embodiment, an epitaxial substrate for a semiconductor device in which a leakage current in a schottky junction portion after continuous conduction is maintained to be as small as that of the initial characteristics can be achieved by making the barrier layer of the epitaxial substrate so as to have tensile strains and such that pits are formed on the surface at the surface density of $5 \times 10^{17}/cm^2$ or more and $1 \times 10^{19}/cm^2$ or less. That is, an epitaxial substrate having excellent schottky contact characteristics that are stable over time is achieved. Also, pits at the above-mentioned surface density can be formed by preferably setting a pressure in the reactor during the formation of a barrier layer in the process of manufacturing an epitaxial substrate.

Second Embodiment

HEMT Device Including Spacer Layer

Figure 7:
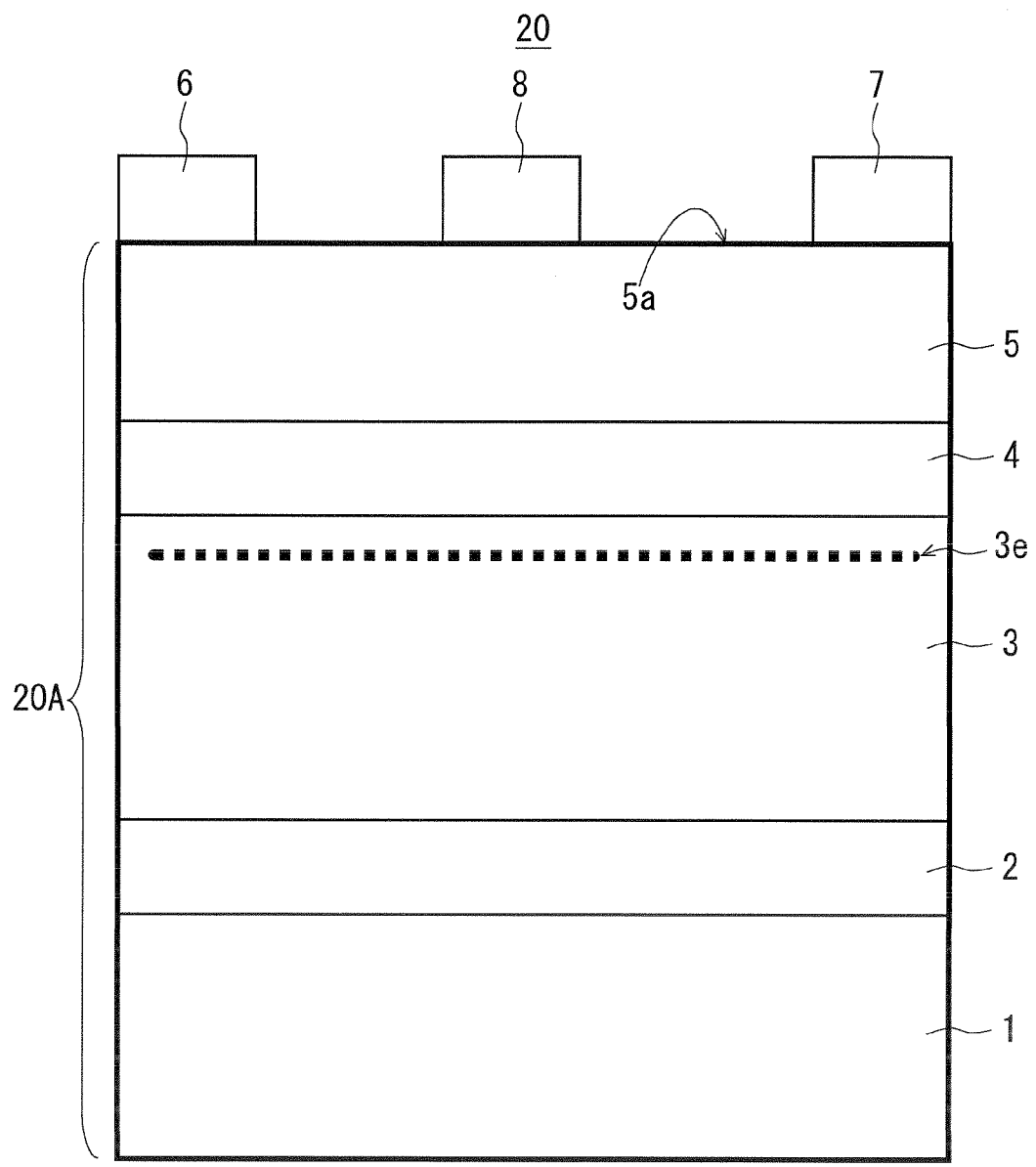
FIG. 7 is a schematic cross-sectional view schematically showing an epitaxial substrate 20A according to a second embodiment of the present invention and a configuration of a HEMT device 20 manufactured using the same.

FIG. 7 is a schematic cross-sectional diagram schematically showing an epitaxial substrate 20A according to a second embodiment of the present invention and the configuration of a HEMT device 20 manufactured using the same. The epitaxial substrate 20A has the configuration in which a spacer layer 4 is interposed between the channel layer 3 and the barrier layer 5 of the epitaxial substrate 10A according to the first embodiment. Constituent elements other than the spacer layer 4 are the same as those of the epitaxial substrate 10A according to the first embodiment, and thus detailed description thereof is omitted.

The spacer layer 4 is a layer formed of a group III nitride (third group III nitride) that has a composition of $In_{x3}Al_{y3}Ga_{z3}N$ (x3+y3+z3=1), contains at least Al, and has a bandgap equal to or larger than the bandgap of the barrier layer 5 so as to have a thickness in a range of 1.2 nm±0.2 nm. It has been confirmed that the characteristics of the epitaxial substrate, such as a sheet resistance and a contact resistance, are not affected within this range. For example, in a case where the spacer layer 4 is formed such that x3=0 and 0≤z3≤0.2, the spacer layer 4 that has a bandgap larger than that of any barrier layer 5 satisfying the above-mentioned second composition range is formed.

In the epitaxial substrate 20A including the spacer layer 4 as described above, the two-dimensional electron gas region 3e in which a two-dimensional electron gas is present at high concentration is formed at the interface between the channel layer 3 and the spacer layer 4 (more specifically, in the portion in the vicinity of the interface of the channel layer 3). If the composition ranges of the channel layer 3 and the barrier layer 5 of the epitaxial substrate 20A are determined in the same manner as the epitaxial substrate 10A according to the first embodiment, a two-dimensional electron gas equal to that of the epitaxial substrate 10A having the corresponding composition is generated also in the two-dimensional electron gas region 3e of the epitaxial substrate 20A.

The spacer layer 4 is preferably formed such that x3=0 and 0≤z3≤0.05. In such a case, an alloy scattering effect is suppressed, and the concentration and mobility of the two-dimensional electron gas are improved. The spacer layer 4 is more preferably formed of AlN (x3=0, y3=1, z3=0). In such a case, the spacer layer 4 is a binary compound of Al and N, and thus an alloy scattering effect is suppressed more compared with the case of a ternary compound containing Ga, with the result that the concentration and mobility of the two-dimensional electron gas are improved.

Note that the discussion regarding the above-mentioned composition range does not exclude the fact that the spacer layer 4 contains impurities. For example, in the case where the channel layer 3 contains oxygen atoms or nitrogen atoms in the concentration range as described above, the spacer layer 4 may contain those in a similar concentration range as well.

Also in the epitaxial substrate 20A according to this embodiment, similarly to the epitaxial substrate 10A according to the first embodiment, the barrier layer 5 is formed so as to have in-plane tensile strains and such that pits are present on the surface 5a at the surface density of $5 \times 10^{17}/cm^2$ or more and $1 \times 10^{19}/cm^2$ or less. Accordingly, in spite of the spacer layer 4 being interposed between the channel layer 3 and the barrier layer 5, in-plane tensile strains are introduced in the barrier layer 5 in the epitaxial substrate 20A. This is achieved by forming the spacer layer 4 itself having a small thickness of 0.5 nm to 1.5 nm so as to have in-plane tensile strains in relation to the channel layer 3, similarly to the barrier layer 5, and subsequently forming the barrier layer 5 on the spacer layer 4 so as to have tensile strains.

As a result, the barrier layer 5 is provided also in the epitaxial substrate 20A as in a similar manner to that of the epitaxial substrate 10A according to the first embodiment, whereby the epitaxial substrate 20A has excellent schottky contact characteristics that are stable over time.

\<Manufacture of Epitaxial Substrate Including Spacer Layer\>

The epitaxial substrate 20A having the above-mentioned structure is manufactured by a similar method to that of the epitaxial substrate 10A according to the first embodiment except for the process of forming the spacer layer 4.

Specifically, in manufacturing the epitaxial substrate 20A, the formation up to the channel layer 3 is performed, the susceptor temperature is set to a spacer layer forming temperature T3 (where T3 is approximately the same as T1). and then the inside of the reactor is maintained at the nitrogen gas atmosphere. Then, the pressure in the reactor is set to 10 kPa, and a metal organic source gas and an ammonia gas are introduced into the reactor, thereby forming an $In_{x3}Al_{y3}Ga_{z3}N$ layer serving as the spacer layer 4 to have a predetermined thickness.

The spacer layer 4 is formed in this manner, and then, the barrier layer 5 is manufactured in a similar procedure to that in the case of manufacturing the above-mentioned epitaxial substrate 10A.

Note that the channel layer forming temperature T1 is set in the range where $950°\ C. \leq T1 \leq 1,250°\ C.$, whereas the barrier layer forming temperature T2 is set in the range where $650°\ C. \leq T2 \leq 800°\ C.$ in accordance with the InN mole fraction of the barrier layer 5, as described above. In addition, the spacer layer forming temperature T3 (° C.) is set to be approximately the same as the channel layer forming temperature T1 (° C.) as well. Therefore, in order to form the barrier layer 5, the susceptor temperature needs to be lowered after the formation of the channel layer 3 or the spacer layer 4. In the course of manufacturing the epitaxial substrate 10A according to the first embodiment, which does not include the spacer layer 4, the surface of the channel layer 3 remains exposed while the temperature drops, and thus this surface may be etched by an atmosphere gas. In contrast, in the case where the spacer layer 4 is provided at the spacer layer forming temperature T3 that is approximately the same as the channel layer forming temperature T1 as in this embodiment, the susceptor temperature is lowered after the formation of the spacer layer 4, whereby the spacer layer 4 acts as a protective layer of the surface of the channel layer 3. It is considered that the above also contributes to improvement in mobility of a two-dimensional electron gas.

As described above, according to this embodiment, in an epitaxial substrate in which the compositions of a channel layer and a barrier layer are determined as in the epitaxial substrate according to the first embodiment, by providing a spacer layer between the channel layer and the barrier layer, it is possible to achieve an epitaxial substrate for a semiconductor device in which a leakage current in a schottky junction portion after continuous conduction is kept as small as that of the initial characteristics, similarly to the epitaxial substrate according to the first embodiment.

Example

A number of epitaxial substrates 20A were manufactured by variously changing the composition of the barrier layer 5 and the pressure in the reactor in the formation of the barrier layer 5, and characteristics thereof were evaluated. FIG. 8 is a diagram showing a list of the formation conditions for the barrier layer 5 in that case and evaluation results.

Specifically, the composition of the barrier layer 5 is varied in twelve levels shown in FIG. 8 within the second composition range while the composition of the channel layer 3 is fixed to GaN, and the pressure in the reactor is also varied in four levels shown in FIG. 8 depending on composition, thereby manufacturing 48 types of epitaxial substrates 20A in total.

Until the formation of the channel layer 3 and the spacer layer 4, a similar procedure was performed in any of the epitaxial substrates 20A.

First, a 6H-SiC substrate having (0001) plane orientation, having an n-type conductivity and having a diameter of three inches was prepared as a substrate. The prepared substrate was placed in the MOCVD reactor, and the inside of the reactor was replaced with a vacuum gas. Then, a pressure in the reactor was set to 30 kPa, and an atmosphere in a hydrogen/nitrogen mixed flow state was formed. After that, the temperature of the substrate was raised through susceptor heating.

When the susceptor temperature reached 1,100° C., a TMA bubbling gas and an ammonia gas were introduced into the reactor, thereby forming an AlN layer serving as the buffer layer 2 having a thickness of 200 nm.

Then, the susceptor temperature was set to 1,100° C., and a metal organic source gas and an ammonia gas were introduced into the reactor at a predetermined flow rate, thereby forming a GaN layer serving as the channel layer 3 to have a thickness of 2 μm.

After the channel layer 3 was obtained, the pressure in the reactor was set to 10 kPa, and then, a TMA bubbling gas and an ammonia gas were introduced into the reactor, thereby forming an AlN layer serving as the spacer layer 4 to have a thickness of 1.2 nm.

After the spacer layer 4 was formed, the susceptor temperature was set to a value appropriate for the composition of the barrier layer 5 to be manufactured, and the pressure in the reactor was set to values shown in FIG. 8. Further, a metal organic bubbling gas and an ammonia gas were introduced into the reactor at gas flow rates respectively appropriate for compositions thereof, thereby forming the barrier layer 5 having a target composition to have a thickness of 18 nm.

After the formation of the barrier layer 5, the susceptor temperature was lowered to approximately room temperature, and the reactor was made open to the atmosphere. Then, the manufactured epitaxial substrate 20A was taken out.

Figure 9A:
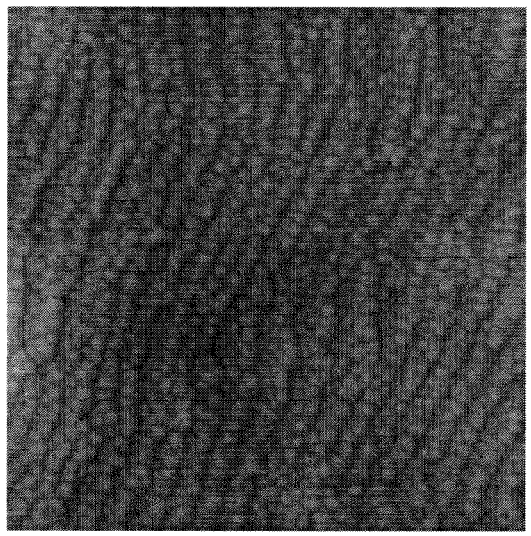
FIGS. 9A, 9B, and 9C show AFM images of a surface 5a of the barrier layer 5 in the epitaxial substrate 20A in which the composition of the barrier layer 5 is $In_{0.15}Al_{0.85}N$.
Figure 9B:
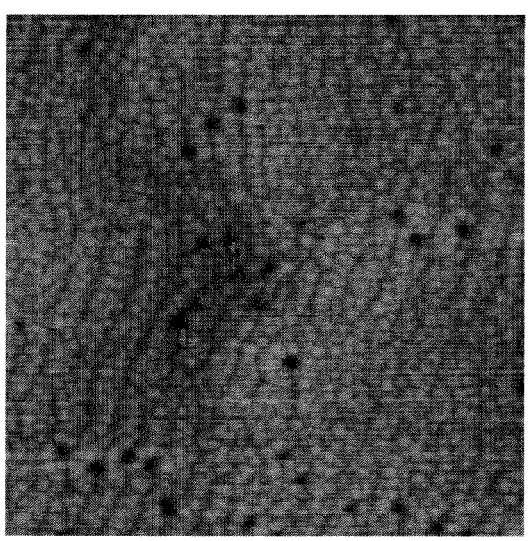
Figure 9C:
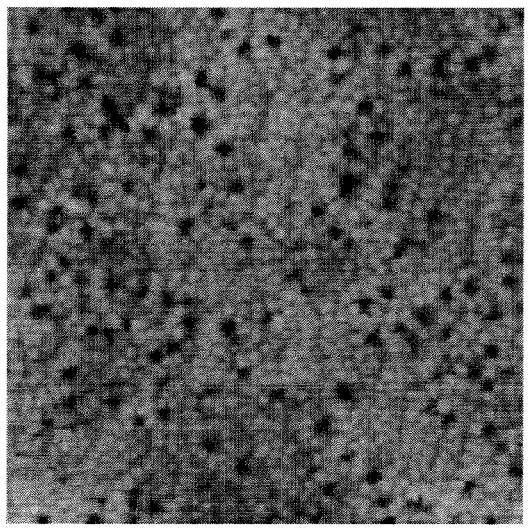

The obtained epitaxial substrate 20A was observed with an atomic force microscope (AFM), and the pit density (surface density) of the surface thereof (surface 5a of the barrier layer 5) was calculated. FIGS. 9A, 9B and 9C show AFM images (3 μm square) on the surface 5a of the barrier layer 5 of the epitaxial substrate 20A in which the composition of the barrier layer 5 is $In_{0.15}Al_{0.85}N$. FIGS. 9A, 9B and 9C show images in the cases where the pressure in the reactor is 1 kPa, 20 kPa and 50 kPa, respectively. It is confirmed from FIGS. 9A, 9B and 9C that the number of pits visually identified as black spots increases as the pressure in the reactor increases. The calculation results of the pit density in the epitaxial substrates 20A are as shown in FIG. 8.

Electric characteristics of the all obtained epitaxial substrates 20A were evaluated by the Hall measurement. As to the epitaxial substrate 20A for Hall measurement, a metal layer formed of Ti/Al/Ni/Au (film thickness thereof is 25/75/15/100 nm) was formed on the barrier layer 5 as an ohmic electrode, and further, heat treatment was performed for 30 seconds in the nitrogen gas atmosphere at 800° C. for obtaining excellent ohmic contact characteristics. The values of the sheet resistances obtained by the Hall measurement are as shown in FIG. 8.

Then, in order to evaluate the schottky contact characteristics of the epitaxial substrates 20A, a concentric schottky diode including the epitaxial substrate 20A was manufactured. A cathode ohmic electrode serving as an outer pattern of a concentric electrode pattern was formed on the barrier layer 5 with a similar layer configuration and on similar conditions to those used in the Hall measurement. A metal layer formed of Pt/Au (film thickness thereof is 20/200 nm) was formed on the barrier layer as an anode schottky electrode serving as an inner pattern of the concentric pattern. The diameter of the anode schottky electrode was set to 200 μm, and a distance between the anode schottky electrode and the cathode ohmic electrode was set to 10 μm.

As to the concentric schottky diode device, a voltage of 40 V was applied to the schottky junction portion composed of the anode schottky electrode and the barrier layer 5 at a room temperature, and a leakage current as initial characteristics was measured. Then, continuous conduction in the state in which a voltage of 200 V was applied at 150° C. was performed for 48 hours, and then, the leakage current at a room temperature was measured on similar conditions to those described above. Also, a breakdown voltage that leads to a device breakdown was measured. The values of the leakage current and breakdown voltage are as shown in FIG. 8.

Figure 10:
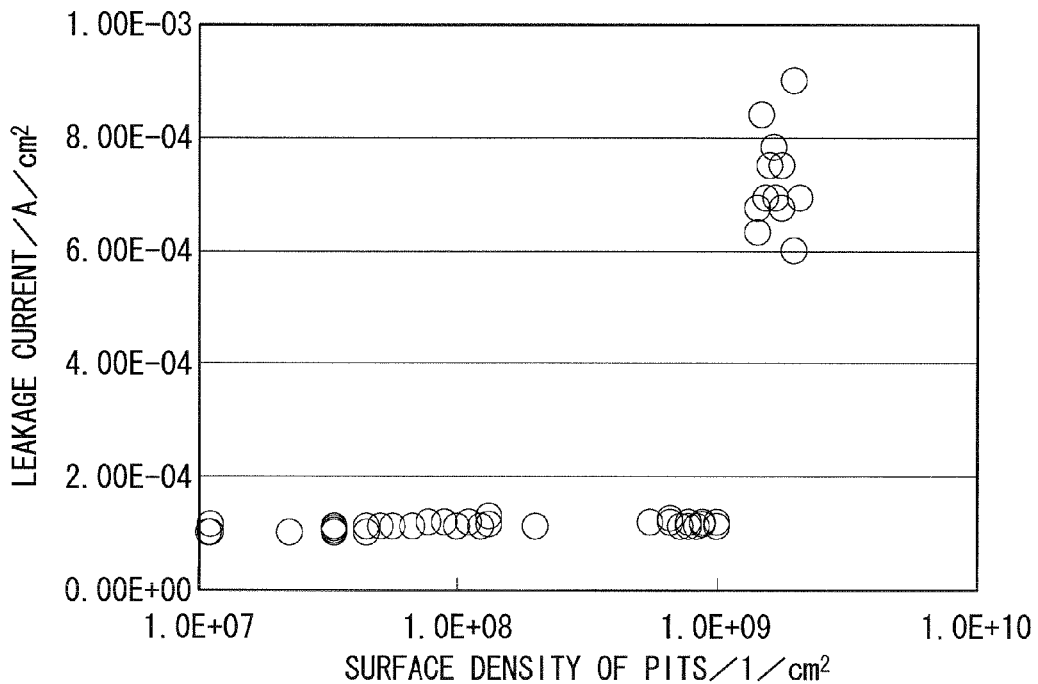
FIG. 10 is a diagram in which a leakage current before continuous conduction is plotted with respect to pit density.
Figure 11:
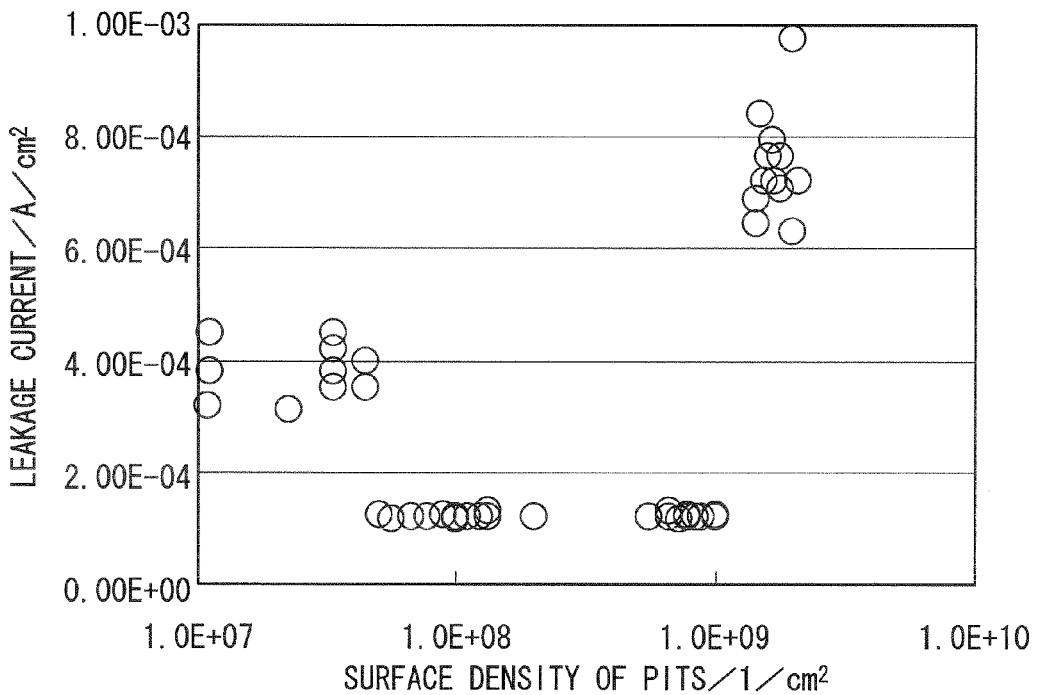
FIG. 11 is a diagram in which a leakage current after continuous conduction is plotted with respect to the surface density of pits.

FIG. 10 is a diagram in which a leakage current before performing continuous conduction is plotted with respect to the pit density in accordance with the results shown in FIG. 8. FIG. 11 is a diagram in which a leakage current after continuous conduction is plotted with respect to a surface density of pits in accordance with the results shown in FIG. 8 as well.

It is found from FIG. 10 and FIG. 11 that only in a case where the surface density of pits falls within the range of $5 \times 10^{17}/cm^2$ or more to $1 \times 10^{19}/cm^2$ or less, the leakage current after continuous conduction as well as for the initial characteristics is suppressed to be $0.2 \, mA/cm^2$ or less and that values thereof are approximately identical. This shows that the leakage current in the schottky junction portion after continuous conduction is kept as small as that of initial characteristics. The results mean that an epitaxial substrate having excellent schottky contact characteristics that are stable over time can be obtained by introducing pits into the surface of the barrier layer for obtaining a surface density within the range.

Taking the results shown in FIG. 8 into consideration as well, it can be said that in the epitaxial substrate capable of obtaining excellent schottky contact characteristics as described above, a sheet resistance tends to be relatively low and a breakdown voltage as high as 460 V or more is achieved.

The invention claimed is:

1. An epitaxial substrate for semiconductor device, comprising:
a base substrate;
a channel layer formed of a first group III nitride containing at least Ga and having a composition of $In_{x1}Al_{y1}Ga_{z1}N$ (x1+y1+z1=1); and
a barrier layer formed of a second group III nitride containing at least In and Al and having a composition of $In_{x2}Al_{y2}Ga_{z2}N$ (x2+y2+z2=1),
wherein the composition of said first group III nitride falls within a range determined by x1=0 and 0≤y1≤0.3,
the composition of said second group III nitride falls, in a ternary phase diagram with InN, AlN and GaN being vertices, within a first composition range surrounded by straight lines respectively represented by expressions below determined in accordance with the composition of said first group III nitride:

$$x2 = \frac{y2 - y1}{4.56} = -\frac{z2 - (1 - y1)}{5.56};$$

z2=0; and
x2=0,
said barrier layer has tensile strains in an in-plane direction, and
pits are formed on a surface of said barrier layer at a surface density of $5 \times 10^7/cm^2$ or more and $1 \times 10^9/cm^2$ or less.

2. The epitaxial substrate for semiconductor device according to claim 1, wherein the composition of said second group III nitride falls within said first composition range and further falls within a range surrounded by straight lines respectively represented by expressions below:

$$x2 = \frac{y2 - (0.36 + 0.5y1)}{1.78} = -\frac{z2 - (0.64 - 0.5y1)}{2.78};$$

$$x2 = \frac{y2 - (0.45 + y1)}{4.5} = -\frac{z2 - (0.55 - y1)}{5.5}; \text{ and}$$

$$x2 = -\frac{y2 - (0.9 - 0.7y1)}{4.5} = \frac{z2 - (0.1 + 0.7y1)}{3.5}.$$

3. The epitaxial substrate for semiconductor device according to claim 1, further comprising
a spacer layer of AlN between said channel layer and said barrier layer.

4. The epitaxial substrate for semiconductor device according to claim 1, wherein said first group III nitride is GaN.

5. The epitaxial substrate for semiconductor device according to claim 2, further comprising
a spacer layer of AlN between said channel layer and said barrier layer.

6. The epitaxial substrate for semiconductor device according to claim 2, wherein said first group III nitride is GaN.

7. A semiconductor device comprising an epitaxial substrate, said epitaxial substrate comprising:
a base substrate;
a channel layer formed of a first group III nitride containing at least Ga and having a composition of $In_{x1}Al_{y1}Ga_{z1}N$ (x1+y1+z1=1); and
a barrier layer formed of a second group III nitride containing at least In and Al and having a composition of $In_{x2}Al_{y2}Ga_{z2}N$ (x2+y2+z2=1),
wherein the composition of said first group III nitride falls within a range determined by x1=0 and 0≤y1≤0.3,
the composition of said second group III nitride falls, in a ternary phase diagram with InN, AlN and GaN being vertices, within a first composition range surrounded by straight lines respectively represented by expressions below determined in accordance with the composition of said first group III nitride:

$$x2 = \frac{y2 - y1}{4.56} = -\frac{z2 - (1 - y1)}{5.56};$$

z2=0; and
x2=0, said barrier layer has tensile strains in an in-plane direction, and pits are formed on a surface of said barrier layer at a surface density of $5 \times 10^7 / cm^2$ or more and $1 \times 10^9 / cm^2$ or less.

8. The semiconductor device for semiconductor device according to claim 7, wherein the composition of said second group III nitride falls within said first composition range and further falls within a range surrounded by straight lines respectively represented by expressions below:

$$x2 = \frac{y2 - (0.36 + 0.5y1)}{1.78} = -\frac{z2 - (0.64 - 0.5y1)}{2.78};$$

$$x2 = \frac{y2 - (0.45 + y1)}{4.5} = -\frac{z2 - (0.55 - y1)}{5.5}; \text{ and}$$

$$x2 = -\frac{y2 - (0.9 - 0.7y1)}{4.5} = \frac{z2 - (0.1 + 0.7y1)}{3.5}.$$

9. The semiconductor device for semiconductor device according to claim 7, further comprising a spacer layer of AlN between said channel layer and said barrier layer.

10. The semiconductor device for semiconductor device according to claim 7, wherein said first group III nitride is GaN.

\* \* \* \* \*